United States Patent
Lewis et al.

(10) Patent No.: US 6,895,570 B2
(45) Date of Patent: May 17, 2005

(54) SYSTEM AND METHOD FOR OPTIMIZING ROUTING LINES IN A PROGRAMMABLE LOGIC DEVICE

(75) Inventors: David M. Lewis, Toronto (CA); Vaughn Betz, Toronto (CA); Paul Leventis, Toronto (CA); Michael Chan, Scarborough (CA); Cameron R. McClintock, Mountain View, CA (US); Andy L. Lee, San Jose, CA (US); Christopher F. Lane, San Jose, CA (US); Srinivas T. Reddy, Fremont, CA (US); Richard Cliff, Los Altos, CA (US)

(73) Assignee: Altera Corporation, San Jose, CA (US)

( * ) Notice: Subject to any disclaimer, the term of this patent is extended or adjusted under 35 U.S.C. 154(b) by 81 days.

(21) Appl. No.: 10/057,232

(22) Filed: Jan. 25, 2002

(65) Prior Publication Data

US 2002/0166106 A1 Nov. 7, 2002

Related U.S. Application Data

(60) Provisional application No. 60/289,177, filed on May 6, 2001.

(51) Int. Cl.$^7$ .............................................. G06F 17/50

(52) U.S. Cl. .............................. 716/16; 716/12

(58) Field of Search .......................... 716/12, 13, 16, 716/14; 326/36, 41, 101, 39

(56) References Cited

U.S. PATENT DOCUMENTS

| | | | |
|---|---|---|---|
| 4,847,612 A | * 7/1989 | Kaplinsky | 326/10 |
| 4,870,302 A | 9/1989 | Freeman | 307/465 |
| 5,212,652 A | * 5/1993 | Agrawal et al. | 326/41 |
| 5,243,238 A | 9/1993 | Kean | 307/465 |
| 5,258,668 A | * 11/1993 | Cliff et al. | 326/41 |
| 5,260,611 A | 11/1993 | Cliff et al. | 307/465 |

(Continued)

OTHER PUBLICATIONS

Kluwer Academic Publishers, Vaughn Betz, Jonathan Rose, Alexander Marquardt, *Architecture and CAD for Deep–Submicron FPGAs*, Chapter 2.1 (pp. 11–18), Chapter 4 (pp. 63–103), Capter 5 (pp. 105–126), and Chapter 7 (pp. 151–190), (Mar. 1999).

*Primary Examiner*—Leigh M. Garbowski
*Assistant Examiner*—Lex H. Malsawma
(74) *Attorney, Agent, or Firm*—Morrison & Foerster LLP

(57) ABSTRACT

An embodiment of this invention pertains to a wire that interconnects multiple function blocks within a programmable logic device ("PLD"). An electrically optimum physical length is determined for the wire. A wire having the electrically optimum physical length transmits a signal down the wire as fast as possible. Some of the wires used in the PLD have a physical length substantially the same as the electrically optimum physical length or an adjustment of the electrically optimum physical length to account for non-electrical considerations. The physical length, as used herein, is the measured length of the wire. A logical length of the wire, as used herein, is the number of function blocks that the wire spans. Given that the function blocks have a different height and width, the logical length of the wire varies depending on the orientation of the wire.

A routing architecture is an array that includes rows and columns of function blocks. The columns of the array are connected with horizontal lines ("H-line") and the rows of the array are connected with vertical lines ("V-line). The types of H-lines include a H4 line that spans four function blocks, a H8 line that spans eight function blocks, and a H24 line that spans twenty-four function blocks. The types of V-lines include a V4 line that spans four function blocks, a V8 line that spans eight function blocks, and a V16 line that spans sixteen function blocks.

46 Claims, 11 Drawing Sheets

U.S. PATENT DOCUMENTS

| | | | | |
|---|---|---|---|---|
| 5,371,422 A | * | 12/1994 | Patel et al. | 326/41 |
| 5,455,525 A | | 10/1995 | Ho et al. | 326/41 |
| 5,485,103 A | | 1/1996 | Pederson et al. | 326/41 |
| 5,490,074 A | * | 2/1996 | Agrawal et al. | 716/16 |
| 5,537,057 A | | 7/1996 | Leong et al. | 326/41 |
| 5,541,530 A | | 7/1996 | Cliff et al. | 326/41 |
| 5,581,199 A | | 12/1996 | Pierce et al. | 326/41 |
| 5,592,106 A | | 1/1997 | Leong et al. | 326/41 |
| 5,682,107 A | | 10/1997 | Tavana et al. | 326/41 |
| 5,689,195 A | | 11/1997 | Cliff et al. | 326/41 |
| 5,701,091 A | | 12/1997 | Kean | 326/41 |
| 5,705,939 A | | 1/1998 | McClintock et al. | 326/41 |
| 5,818,730 A | * | 10/1998 | Young | 716/14 |
| 5,847,579 A | | 12/1998 | Trimberger | 326/41 |
| 5,880,598 A | | 3/1999 | Duong | 326/41 |
| 5,907,248 A | | 5/1999 | Bauer et al. | 326/39 |
| 5,909,126 A | | 6/1999 | Cliff et al. | 326/41 |
| 5,914,616 A | | 6/1999 | Young et al. | 326/41 |
| 5,942,913 A | | 8/1999 | Young et al. | 326/41 |
| 6,069,490 A | * | 5/2000 | Ochotta et al. | 326/41 |
| 6,084,429 A | | 7/2000 | Trimberger | 326/41 |
| 6,107,824 A | | 8/2000 | Reddy et al. | 326/41 |
| 6,204,690 B1 | | 3/2001 | Young et al. | 326/41 |
| 6,278,291 B1 | | 8/2001 | McClintock et al. | 326/41 |
| 6,292,018 B1 | | 9/2001 | Kean | 326/41 |
| 6,300,794 B1 | | 10/2001 | Reddy et al. | 326/41 |

* cited by examiner

Routing
Architecture
448

US 6,895,570 B2

SYSTEM AND METHOD FOR OPTIMIZING ROUTING LINES IN A PROGRAMMABLE LOGIC DEVICE

CROSS-REFERENCE TO RELATED APPLICATIONS

This application claims the benefit of U.S. Provisional Application Ser. No. 60/289,177, filed May 6, 2001, and entitled "Asymmetric Routing Lines."

BACKGROUND OF THE INVENTION

1. Field of the Invention

This invention relates generally to integrated circuits and, in particular, to routing wires within a programmable logic device.

2. Description of the Related Art

A programmable logic device ("PLD") is a digital, user-configurable integrated circuit used to implement a custom logic function. For the purposes of this description, the term PLD encompasses any digital logic circuit configured by the end-user, and includes a programmable logic array, a field programmable gate array, and an erasable and complex PLD. The basic building block of the PLD is a logic element that is capable of performing limited logic functions on a number of input variables. A logic element is typically equipped with circuitry to programmably implement the "sum of products" logic, as well as one or more registers to implement sequential logic. Conventional PLDs combine together large numbers of such logic elements through an array of programmable interconnects to facilitate implementation of complex logic functions. PLDs have found particularly wide application as a result of their combined low up front cost and versatility to the user.

A variety of PLD architectural approaches arranging the interconnect array and logic elements have been developed to optimize logic density and signal routability between the various logic elements. The logic elements are arranged in groups of, for example, eight to form a larger logic array block ("LAB"). Multiple LABs are arranged in a two dimensional array and are programmably connectable to each other through global horizontal and vertical interconnect channels. Each of the horizontal and vertical channels includes one or more routing wires ("wires"). Some of the wires in each channel span a large number of LABs (e.g., 24 LABs) while other wires only span a few number of LABs (e.g., 4 LABs).

Each wire of a channel has electrical properties that include the resistance and capacitance of the wire. These electrical properties are predominantly determined by its physical length. An electrically optimum wire transmits a signal down the wire as fast as possible. There is an optimum physical length for the wire that transmits a signal down the wire as fast as possible per unit distance and hence for any distance between a source LAB and a destination LAB. Within the PLD, the wires spanning the large number of LABs and the wires spanning the few number of LABs are not electrically optimized. Electrically optimizing the wires, especially the wires spanning the large number of LABs or on a speed critical path, improve PLD performance.

For the foregoing reasons, it is desirable to have routing wires that are electrically optimum to improve PLD performance.

SUMMARY OF THE INVENTION

According to an embodiment of the present invention, a routing architecture to interconnect multiple function blocks is described. The routing architecture includes multiple wires and a first subset of the multiple wires is oriented in a first and second direction and has a first logical length. A second subset of the multiple wires is oriented in another first and second direction and has different logical lengths. The first and the second subset of the multiple wires oriented in their respective first and second directions correspond to each other.

DETAILED DESCRIPTION OF THE INVENTION

Figure 1:
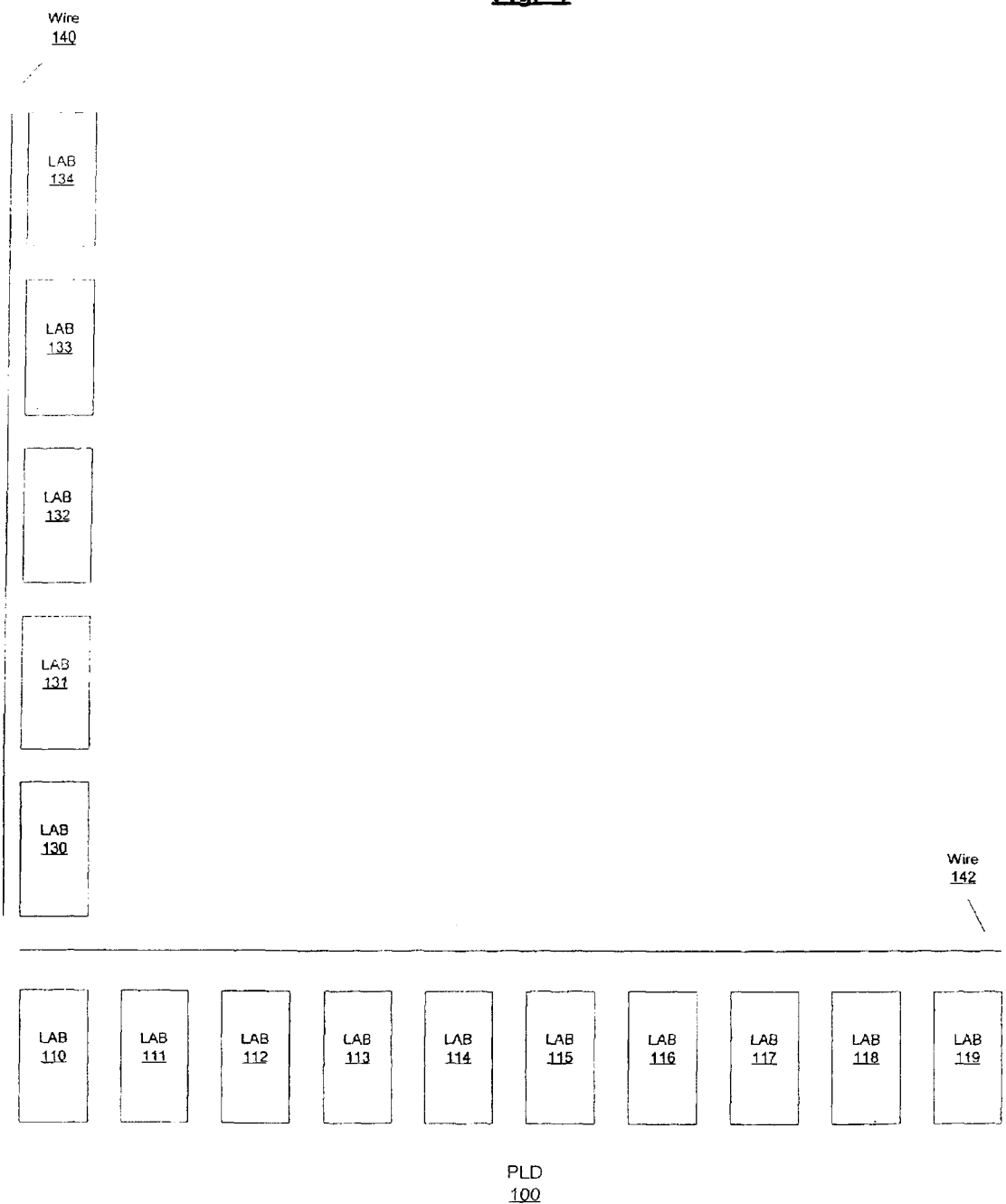
FIG. 1 shows an example of an embodiment of an electrically optimized horizontal wire and vertical wire within a programmable logic device ("PLD") according to the present invention.

The physical dimensions of a function block (e.g., the LAB, a memory block, an input/output block, or a multiply-accumulate block ("MAC")) within the PLD may be such that the function block has a different height and width. For example, the function block may have the width of 100 microns and the height of 200 microns. The function block within a 2-dimensional array uses horizontal and vertical wires and drivers to transmit or receive signals. In the rest of the description, when a reference is made to a driver, this reference includes the wire plus one or more drivers to drive the wire. The horizontal wires and the vertical wires belong to horizontal channels and vertical channels respectively. In the case where the function block has a different height and width, if a horizontal wire and a vertical wire traverse the same fixed number of function blocks, then at least one of either the horizontal wire or the vertical wire is not electrically optimum since their lengths differ. In order to achieve electrical optimization for both wires, an electrically optimum physical length for the wires is determined that makes the wires as fast as possible. Both the horizontal wire and the vertical wire have this electrically optimum physical length or are close to this electrically optimum physical length. The two wires have the same physical length but because the height and width of the function block differ, the two wires have asymmetric logical lengths, i.e., different logical lengths. In order to provide concrete examples, the remainder of the document employs LABs, however, this embodiment includes the use of other a types of function blocks. Also, when a connection is described below, that connection includes a programmable connection such as static random-access memory, dynamic random-access memory, electrically erasable programmable read-only memory, flash, fuse, and antifuse programmable connections. The programmable connection could also be implemented through mask programming during the fabrication of the device. While mask programming has disadvantages of the field programmable options listed above, it may be useful in certain high volume applications.

The physical length, as used herein, is the measured length of the wire and is expressed in, for example, microns. The logical length of the wire, as used herein, is the number of function blocks (e.g., LABs) that the wire spans. The logical length of the wire can be calculated by dividing the physical length of the wire by the height or width of the LAB. For example, assume that a LAB has a width of 100 microns, a height of 200 microns, and an electrically optimum physical length of 1000 microns, the logical length of the horizontal wire is equal to 10 LABs (1000 microns/100 microns) and the logical length of the vertical wire is equal to 5 LABs (1000 microns/200 microns). The LABs connected by the wire may not all have the same height or the same width (e.g., a first LAB connected by the wire may have a height of 200 microns and a second LAB connected by the wire may have a height of 180 microns). In this case, the average height or the average width of the LABs connected by the wire is used to calculate the logical length.

FIG. 1 shows an example of an embodiment of an electrically optimized horizontal wire and vertical wire within a PLD 100 according to the present invention. In this example, each of the LABs in the PLD 100 has a width of 100 microns and a height of 200 microns, though other dimensions for the LAB are possible. Given the electrical characteristics of the wires, the logic devices within the PLD 100, and the layout of the PLD 100, an electrically optimum physical length of the wires is determined. In this example, this electrically optimum physical length is predicted to be 1000 microns. Given this predicted electrically optimum physical length, one of the wires is set to this predicted electrically optimum physical length and the other wire is substantially close to the electrically optimum physical length. In this example, a wire 140 oriented in the vertical direction has the physical length of 1000 microns and a wire 142 oriented in the horizontal direction has the physical length substantially close to 1000 microns. Since the LABs have the width of 100 microns, the wire 142 has a logical length of ten LABs, i.e., the wire 142 spans LABs 110–119 allowing communication over a distance covering these ten LABs. Because the LABs have the height of 200 microns, the wire 140 has a logical length of five LABs, i.e., the wire 140 spans LABs 130–134. In this embodiment, the physical length of one wire has the electrically optimum physical length and the physical length of the other wire is substantially close to the electrically optimum physical length. The logical length of each wire is a function of the orientation (e.g., a wire is oriented in the horizontal direction or the vertical direction) of that wire. The physical length of the wires may be adjusted to be more or less than the electrically optimum physical length depending on non-electrical considerations which are described below.

In another configuration, the two wires are oriented in a diagonal direction. In this configuration, one wire may be oriented diagonally up to the right and the other wire may be oriented diagonally up to the left. Each of the wires oriented diagonally has a physical length substantially close to the electrically optimum physical length. In yet another configuration, more than two wires, each oriented in a different direction, may be used. For example, a first wire may be oriented in the vertical direction, the second wire may be oriented in the horizontal direction, the third wire may be oriented diagonally up to the right, and the fourth wire may be oriented diagonally up to the left. Each of these four wires has a physical length substantially close to the electrically optimum physical length.

In another embodiment, a first wire oriented in one direction and a second wire oriented in a different direction have substantially the same physical length but different logical lengths. In yet another embodiment, two pairs of wires oriented in different directions are included in the routing architecture. The first pair has a first wire in a first direction which has the same logical length as the corresponding second wire in a second direction. The second pair has logical lengths greater than the first pair and the logical length of the first wire of the second pair oriented in the first direction differs from the logical length of the second wire of the second pair oriented in the second direction. In another embodiment, a first wire and a second wire have the same logical length but different physical lengths.

Figure 2:
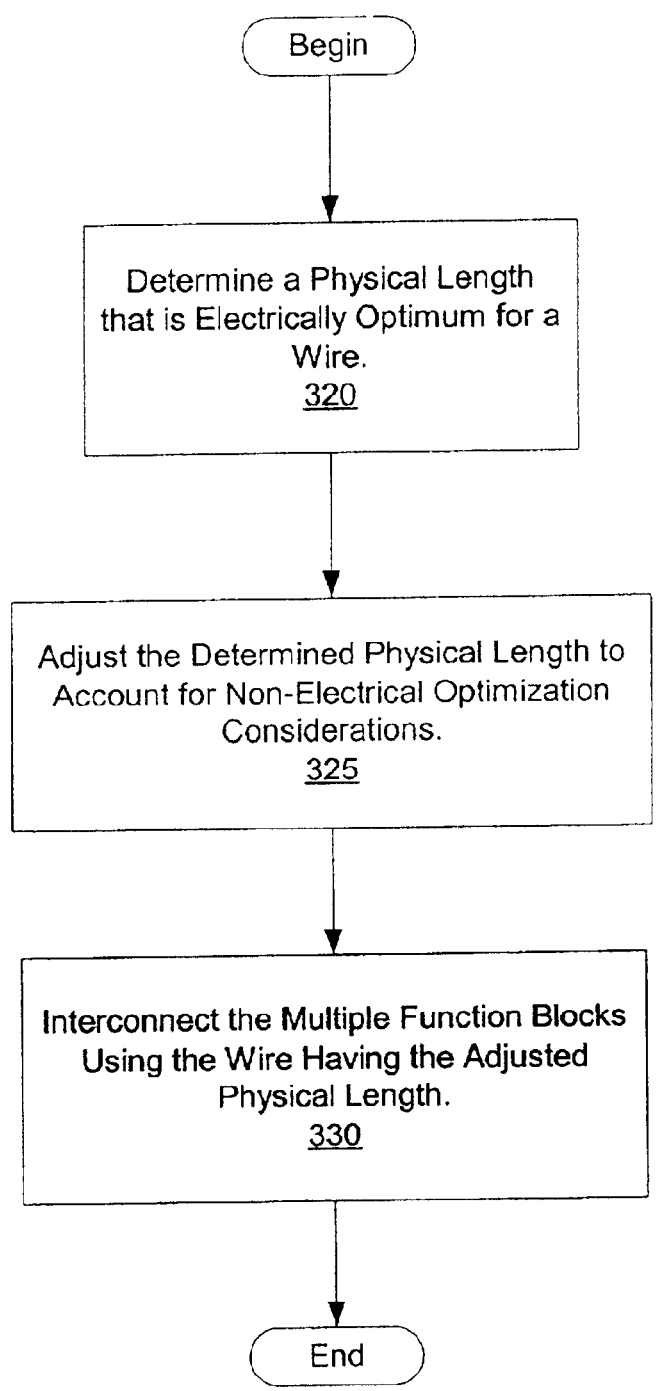
FIG. 2 shows a flowchart of an embodiment of a procedure for interconnecting LABs within the PLD using an electrically optimum wire according to the present invention.
Figure 3:
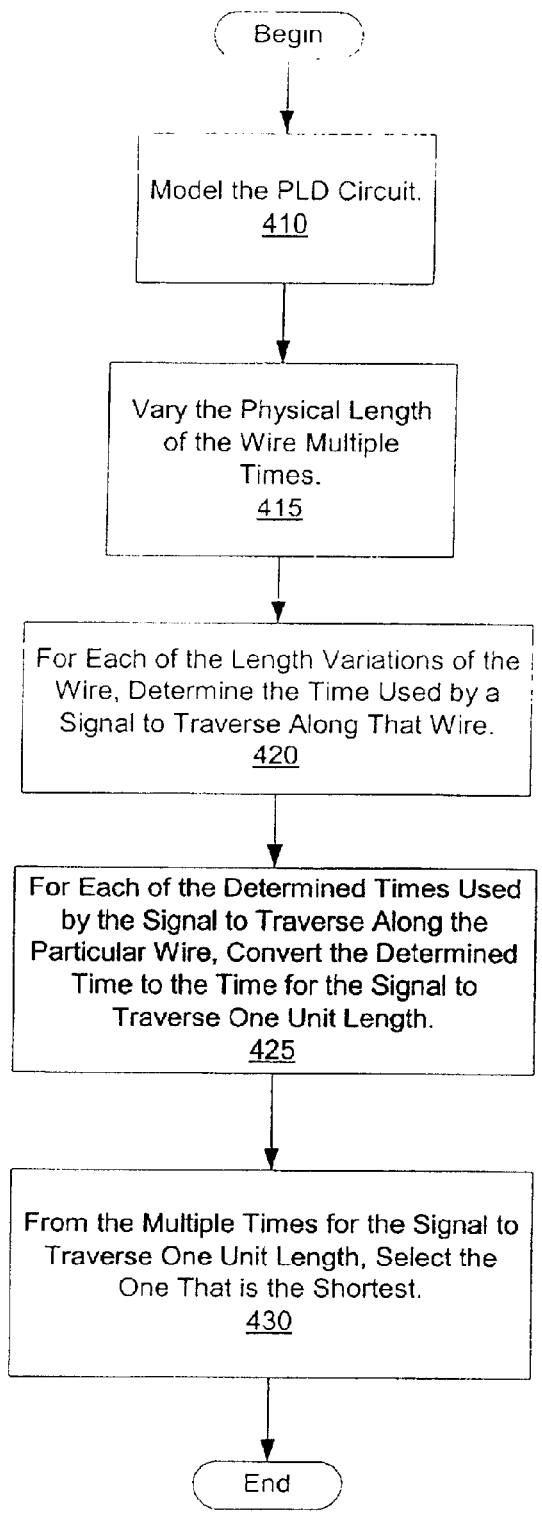
FIG. 3 shows a flowchart for determining the electrically optimum physical length for a wire.

FIG. 2 shows a flowchart of an embodiment of a procedure for interconnecting LABs within the PLD using an electrically optimum wire according to the present invention. In block 320, a physical length that is electrically optimum for a wire is determined. The procedure to determine the electrically optimum physical length is shown in FIG. 3. In block 325, the determined physical length is adjusted to account for non-electrical optimization considerations. These considerations when adjusting the wire length include: First, the routing efficiency with which a wire having the electrically optimum physical length is used. For example, if the electrically optimum physical length is determined to span twenty LABs but the average connection length is only five LABs, then an adjustment is made so that, for a example, the physical length of the wire spans sixteen LABs rather than using the determined electrically optimum physical length of twenty LABs. A tradeoff occurs so that the physical length of the wire not only reflects the determined electrically optimal physical length but also the average connection length. Second, the pattern of connections to the wire is also a non-electrical optimization consideration. For example, if the electrically optimum physical length is determined to span nineteen LABs but connections on the wire are made at every fourth LAB, in order to reduce the number of vias, an adjustment is made so that the physical length of the wire spans a multiple of four LABs. In block 330, the multiple function blocks are interconnected using the wire having the adjusted physical length.

FIG. 3 shows a flowchart for determining the electrically optimum physical length for a wire, i.e., elaborates on block 320 of FIG. 3. In block 410, the PLD circuit is modeled using a computer program such as the Simulation Program for Integrated Circuits Emphasis ("SPICE") developed at the Electronics Research Laboratory at the University of California, Berkeley. In block 415, the physical length of a wire within the PLD that is to be optimized is varied multiple times. The width of this wire is constrained by factors such as the higher cost for wider wires and the space available on the PLD. In block 420, for each of the length variations of the wire, the time used by a signal to traverse the wire having that length variation is determined. In block 425, for each of the determined times for the signal to traverse the wire having the particular physical length, this determined time is converted to the time for the signal to traverse one unit length. In block 430, from the multiple times for the signal to traverse one unit length, a particular one of the multiple times that is the shortest is selected. As an example of this procedure, first, assume that the PLD circuit is modeled using the SPICE simulator. If the wire length used in the PLD is set to 1,000 microns, then assume, for example, that the simulator predicts that a delay of 100 picoseconds is used to traverse along that wire length. If the wire length in the PLD is set to 2,000 microns, then assume that the simulator predicts that the delay is 150 picoseconds. Finally, if the wire length in the PLD is set to 3,000 microns, then assume, for example, that the simulator predicts that the delay is 400 picoseconds. Given these values, the 1,000 micron wire length uses 100 nanoseconds to traverse one meter, the 2,000 micron wire length uses 75 nanoseconds to traverse one meter, and the 3,000 micron wire length uses 133 nanoseconds to traverse one meter. Since the 2000 micron wire uses the least amount of time to traverse one meter, the electrically optimum physical length is set to 2000 microns. The actual length of the wire used may be an adjustment of the electrically optimum physical length to account for non-electrical considerations.

Figure 4:
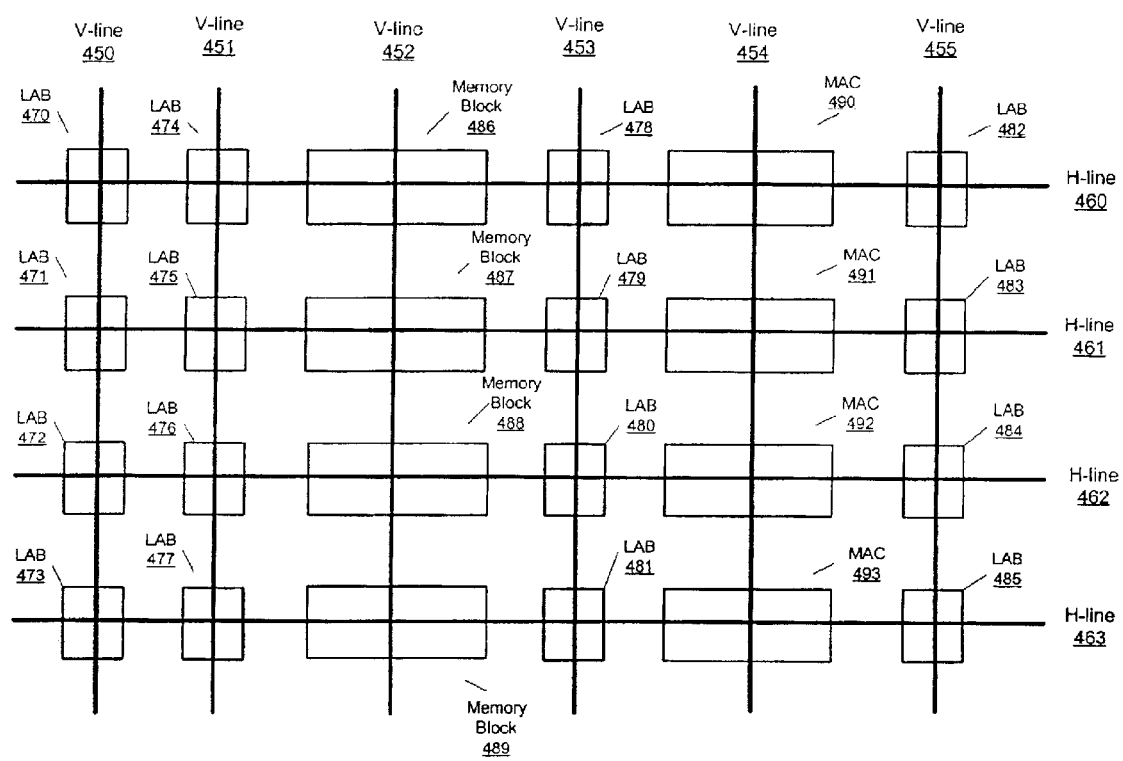
FIG. 4 shows an embodiment of a routing architecture according to the present invention.

FIG. 4 shows an embodiment of a routing architecture 448 according to the present invention. The routing architecture 448 is an array that includes rows and columns of function blocks (e.g., LABs 470–485, memory blocks 486–489, and MACs 490–493). The columns of the array are connected with horizontal lines ("H-line") 460–463 and the rows of the array are connected with vertical lines ("V-line") 450–455.

The types of H-lines include a H4 line that spans four function blocks (i.e., has a logical length of four function blocks), a H8 line that spans eight function blocks, and a H24 line that spans twenty-four function blocks. The types of V-Lines include a V4 line that spans four function blocks, a V8 line that spans eight function blocks, and a V16 line that spans sixteen function blocks. In this embodiment, the function blocks access the H-lines and the V-lines from the left, top and right sides of each function block. Also, the H24 lines and the V16 lines have the electrically optimum physical length or an adjustment of the electrically optimum physical length to account for non-electrical considerations. Even though the H24 lines and the V16 lines have substantially the same physical length, their logical lengths are different. The H-lines and the V-lines may be staggered, i.e., the start and end points of each line are offset by some number of function blocks. Some of the H-lines drive a signal to the right and some of the H-lines drive a signal to the left. Similarly, some of the V-lines drive a signal upwards toward the top edge of the chip and some of the V-lines drive a signal downwards toward the bottom edge of the chip. In another embodiment, some or all of the H-lines and V-lines are bi-directional. A bi-directional wire uses at least one driver to drive a signal through the wire in each of the two different directions.

Figure 5:
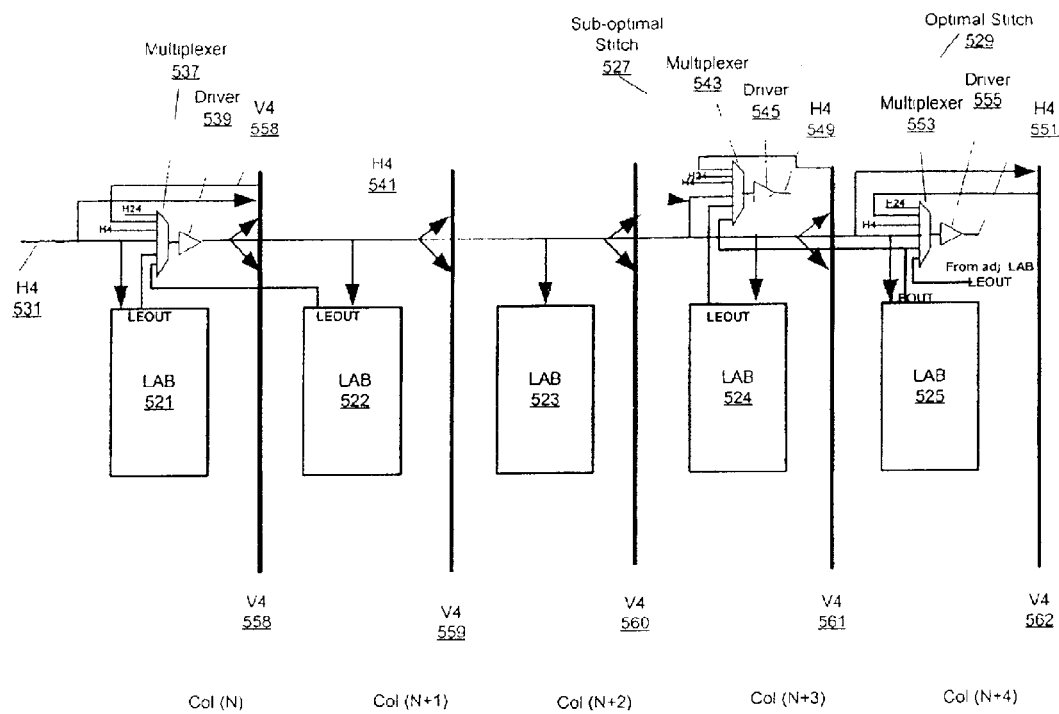
FIG. 5 shows an embodiment of a H4 line according to the present invention.

FIG. 5 shows an embodiment of a H4 line according to the present invention. A row of a 2-dimensional array is shown that includes five columns of LABs. In this embodiment, the H4 line allows horizontal unidirectional communication over a distance covering four function blocks. A H4 line 541 has a starting point at a LAB 521 (i.e., Col. N) and an ending point at a LAB 525 (i.e., Col. N+4). The H4 line 541 can connect to LABs 522–525. A multiplexer 537 selects one of the inputs as its output and this output is driven on the H4 line 541 by a driver 539. The H4 line 541 is driven once at its starting point and thus is an unidirectional line. In FIG. 5, the H4 line 541 is driven to the right from its starting point at the LAB 521 to the ending point at the LAB 525. In another embodiment, the H4 line can be driven to the left or each line is a bi-directional line. The H4 line can connect to upstream and downstream V4 lines at every function block it crosses. It can also connect to H24 lines, V16 lines, and V4 lines. In FIG. 5, the H4 line 541 connects to V4 lines 558–561.

An optimal stitch 529 is the connection of the H4 line 541 at its endpoint (i.e., Col. (N+4) to a H4 line 551 thus extending the reach of a signal carried on the H4 line 541 to the next four LABs. In FIG. 5, the signal flow direction for the H4 line 541 and the H4 line 551 is towards the right. For the optimal stitch 529, the H4 line 541 is connected to an input of a multiplexer 553. A driver 555 drives an output of the multiplexer 553 on the H4 line 551. Using the multiplexer 553 and the driver 555, a signal on the H4 line 541 can also reach the four LABs spanned by the H4 line 551. A sub-optimal stitch is the connection to another H4 line prior to reaching the end point of the H4 line 541. That is, using the sub-optimal stitch, a connection to another H4 line occurs at any one of the LABs 522–524. A sub-optimal stitch 527 includes a multiplexer 543 and a driver 545 at the LAB 524. The multiplexer 543 has one of its inputs coupled to the H4 line 541. An output of the multiplexer 543 is sent to the driver 545 that drives the output on the H4 line 549. The sub-optimal stitch 527 extends the reach of a signal carried on the H4 line 541 to include those LABs spanned by the H4 line 549.

The H4 line 541 can be driven by a LAB output, another H4 line, the H24 line, the V16 line or the V4 line. In FIG. 5, the inputs of the multiplexer 537 are connected to a H24 line, another H4 line, a H4 line 531, an output from the LAB 521, and an output from the adjacent LAB 522. The LAB output can be from either the LAB to which the driver corresponds or from an adjacent LAB. The adjacent LAB is the LAB to the right of the LAB to which the driver corresponds for a right driving H4 line, and is the LAB to the left of the LAB to which the driver corresponds for a left driving H4 line.

Figure 6:
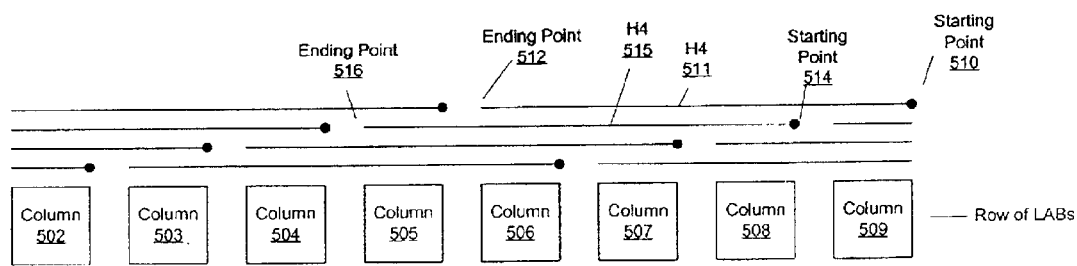
FIG. 6 shows an embodiment of H4 line staggering according to the present invention.

FIG. 6 shows an embodiment of H4 line staggering according to the present invention. A H4 line 511 has a starting point 510 and an ending point 512 that is four column of function blocks away (i.e., the H4 line 511 spans the column of LABs 506–509). A H4 line 515 has a starting point 514 and an ending point 516 that is four column of function blocks away (i.e., the H4 line 515 spans the column of LABs 505–508). The H4 line 511 is driven by a driver at the starting point 510 and the H4 line 51 is driven by a driver at the starting point 514. The offsetting of the start and end point of each line by one or more function blocks is referred to as staggering. In FIG. 6, the starting point 514 is offset from the starting point 510 by one LAB column (i.e., the column 509) and the ending point 516 is offset from the ending point 512 by one LAB column (i.e., the column 505).

Figure 7:
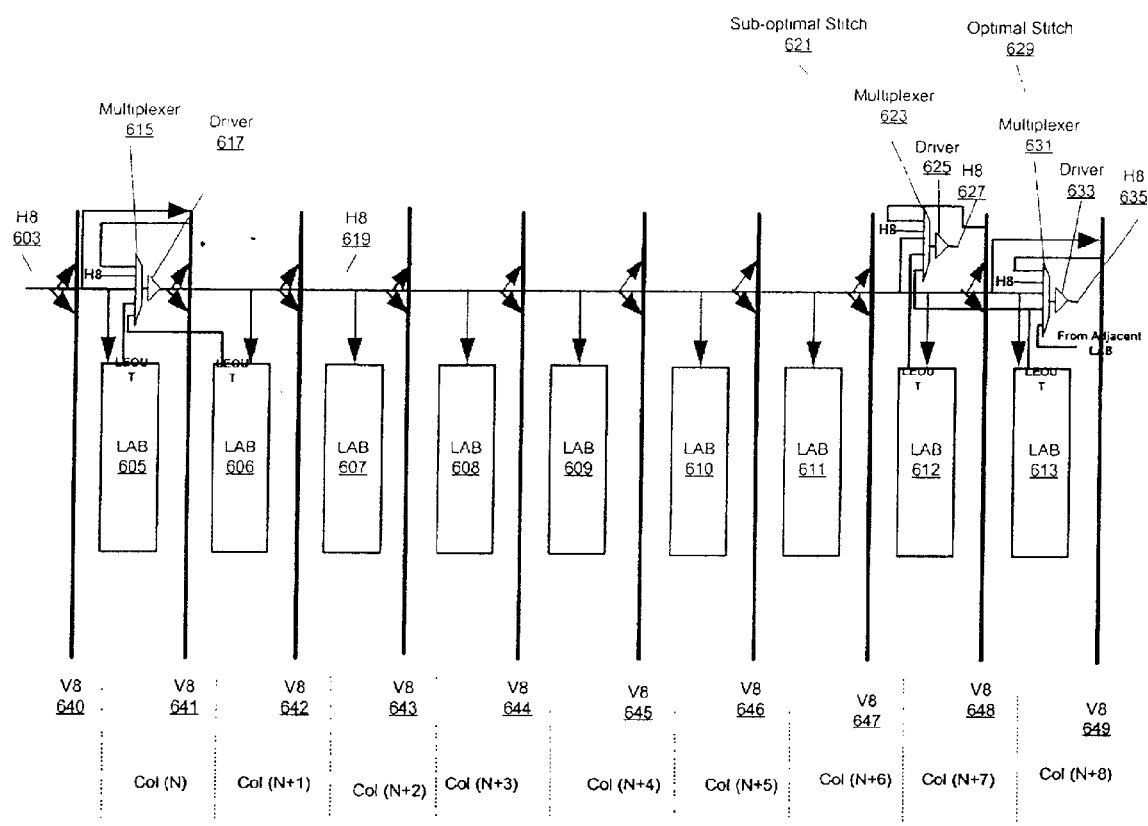
FIG. 7 shows an embodiment of a H8 line according to the present invention.

FIG. 7 shows an embodiment of a H8 line according to the present invention. A row of a 2-dimensional array is shown that includes nine columns of LABs. In this embodiment, the H8 line allows horizontal unidirectional communication over a distance covering eight function blocks. As described earlier for the H4 lines, the H8 lines can also be similarly staggered such that the start and end point of each line is offset by one or more function blocks. A H8 line 619 has a starting point at a LAB 605 (i.e., Col. N) and an ending point at a LAB 613 (i.e., Col. N+8). The H8 line 619 can directly connect to LABs 605–613. A multiplexer 615 selects one of the inputs as its output and this output is driven on the H8 line 619 by a driver 617. The H8 line 619 is driven once at its starting point and thus is an unidirectional line. In FIG. 7, the H8 line 619 is driven to the right from its starting point at the LAB 605 to the ending point at the LAB 613. In another embodiment, the H8 line can be driven to the left or is a bi-directional line. The H8 line can connect to upstream and downstream V8 lines at every function block it crosses. In FIG. 7, the H8 line 619 connects to the V8 lines 641–648.

An optimal stitch 629 is the connection of the H8 line 619 at its endpoint to a H8 line 635 thus extending the reach of a signal carried on the H8 line 619 to the next eight LABs. For the optimal stitch 629, the H8 line 619 is connected to an input of a multiplexer 631. A driver 633 drives an output of the multiplexer 631 on the H8 line 635. Using the multiplexer 631 and the driver 633, a signal on the H8 line 619 can also reach the eight LABs spanned by the H8 line 635. The sub-optimal stitch is the connection to another H8 line prior to reaching the end point of the H8 line 619. That is, using the sub-optimal stitch, a connection to another H8 line occurs at any one of the LABs 606–612. A sub-optimal stitch 621 includes a multiplexer 623 and a driver 625 at the LAB 612. The multiplexer 623 has one of its inputs coupled to the H8 line 619. An output of the multiplexer 623 is sent to the driver 625 that drives the output onto the H8 line 627. The sub-optimal stitch 621 extends the reach of a signal carried on the H8 line 619 to include those LABs spanned by the H8 line 627.

The H8 line 619 can be driven by a LAB output, or the V8 line. In FIG. 7, the inputs of the multiplexer 615 are connected to a H8 line 603, another H8 line, the V8 line 641, an output from the LAB 605, and an output from the adjacent LAB 606. The LAB output can be from either the LAB to which the driver corresponds or from an adjacent LAB. The adjacent LAB is the LAB to the right of the LAB to which the driver corresponds for a right driving H8 line, and is the LAB to the left of the LAB to which the driver corresponds for a left driving H8 line.

In this embodiment, the H8 lines are longer than the H4 lines and a signal travels on the H8 lines faster than on the H4 lines. The H8 lines have twice the width and spacing compared to the H4 lines in the chip layout.

Figure 8:
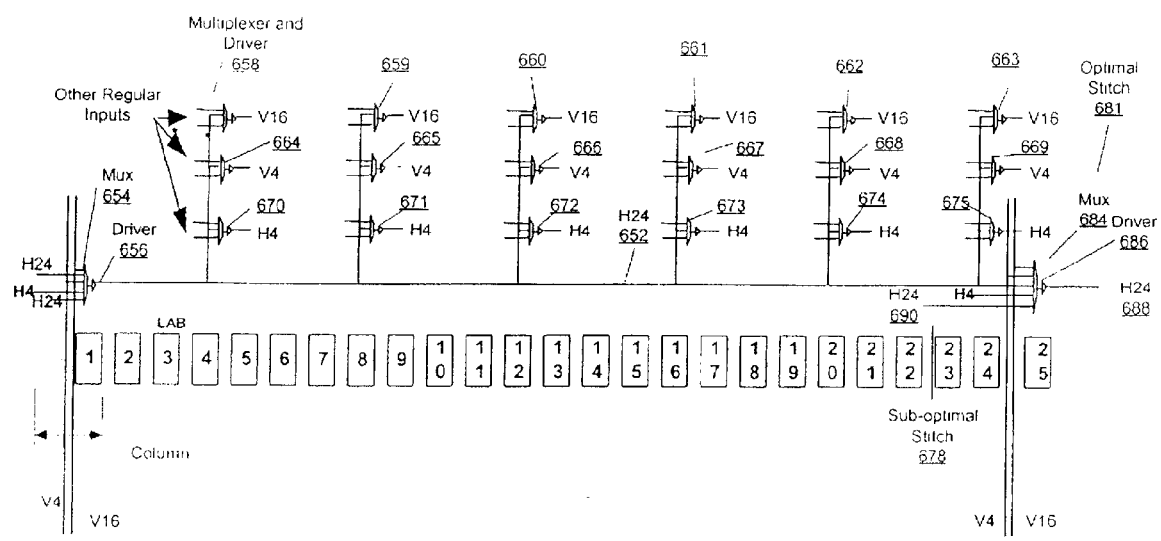
FIG. 8 shows an embodiment of a H24 line according to the present invention.

FIG. 8 shows an embodiment of a H24 line according to the present invention. A row of a 2-dimensional array is shown that includes 25 columns of LABs. In this embodiment, the H24 lines have an electrically optimum physical length or an adjustment of the electrically optimum physical length to account for non-electrical considerations. The H24 line allows horizontal unidirectional communication over a distance covering twenty-four function blocks. The H24 lines are double staggered, i.e., the H24 lines are offset by two function blocks from each other rather than offset by one function block as in the H4 or H8 staggering. In another embodiment, the lines are offset by zero, one, or more than two function blocks. In FIG. 8, a H24 line 652 has a starting point at a LAB # 1 and an ending point at a LAB # 25. A multiplexer 654 selects one of the inputs as its output and this output is driven on the H24 line 652 by a driver 656. The H24 line 652 is driven once at its starting point and thus is an unidirectional line. In FIG. 8, the H24 line 652 is driven to the right from its starting point at the LAB #1 to the ending point at the LAB #25. In another embodiment, the H24 line can be driven to the left or be a bi-directional line.

In this embodiment, the H24 line 652 connects to the H4, the V4, and the V16 lines at every fourth LAB. Connections to these lines (the H4, the V4, or the V16 lines) are made using multiplexer and drivers 658–675 as shown in FIG. 8. An optimal stitch 681 is the connection of the H24 line 652 at its endpoint to a H24 line 688 thus extending the reach of a signal carried on the H24 line 652 to span the next twenty-four LABs. For the optimal stitch 681, the H24 line 652 is connected to an input of a multiplexer 684. A driver 686 drives an output of the multiplexer 684 on the H24 line 688. Using the, multiplexer 684 and the driver 686, a signal on the H24 line 652 can also span the twenty-four LABs covered by the H24 line 688. A sub-optimal stitch is the connection to another H24 line prior to reaching the end point of the H24 line. In FIG. 8, a sub-optimal stitch 678 is shown where it is assumed that a H24 line 690 that is input into the multiplexer 684 is from the H24 line 690 prior to reaching its endpoint. The multiplexer 684 and the driver 686 can drive a signal carried on the H24 line 690 to the H24 line 688.

The H24 line 652 can be driven by the H4 line, the V4 line, the V16 line, and the H24 line. In FIG. 8, the inputs of the multiplexer 654 are connected to a H4 line, two H24 lines, a V4 line, and a V16 line. In this embodiment, the H24 lines do not directly connect to the function blocks.

In this embodiment, the H24 lines are longer than the H8 lines and a signal travels on the H24 lines faster than on the H8 lines. The H24 lines are faster than three H8 lines combined and are routed in the top thick metal layers of the chip. The H24 lines are faster, due in part, to being thicker and wider lines and having greater spacing on the chip. Also, the larger drivers used to drive the H24 lines contribute to their greater speed.

Figure 9:
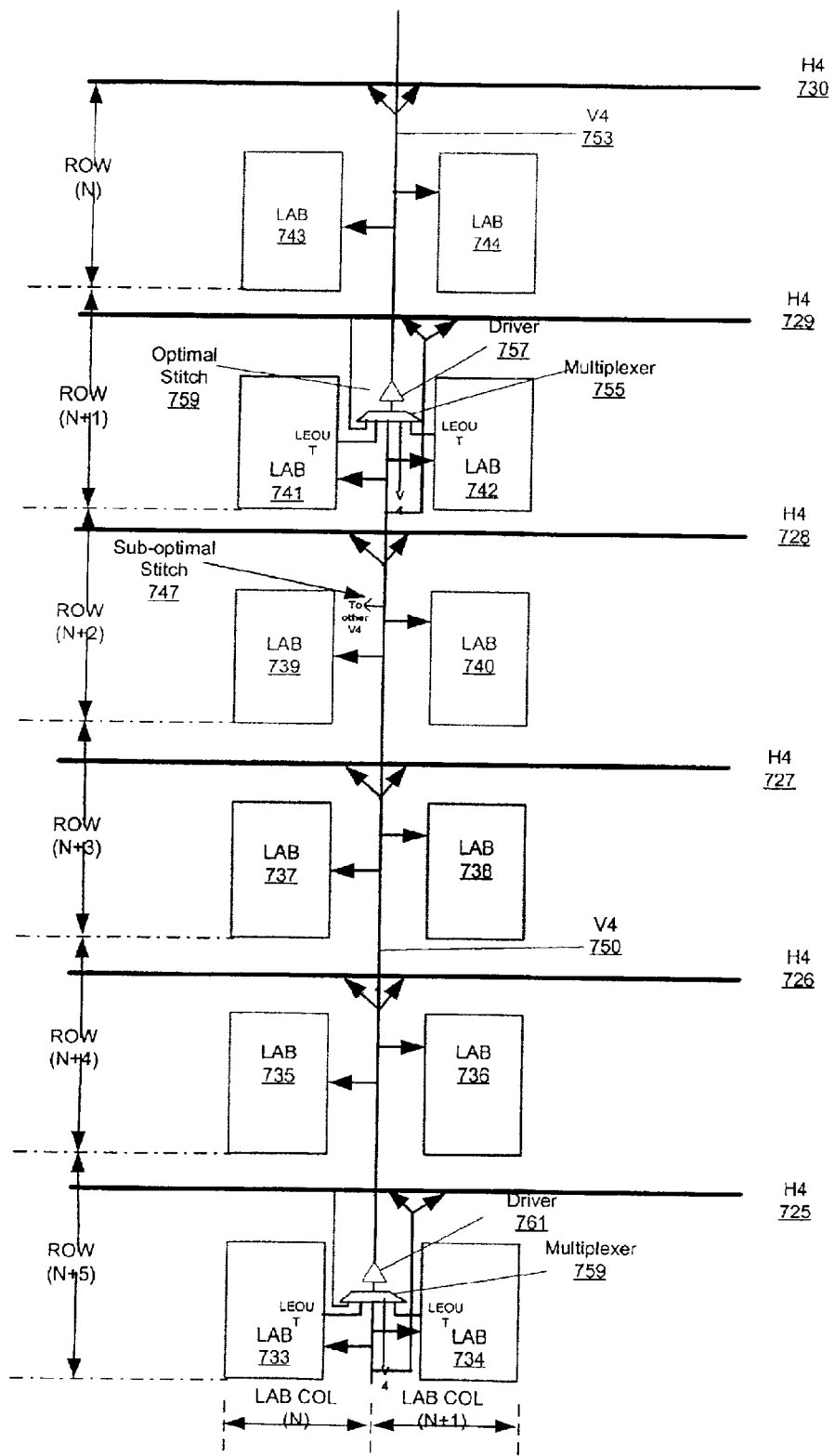
FIG. 9 shows an embodiment of a V4 line according to the present invention.

FIG. 9 shows an embodiment of a V4 line according to the present invention. A column of a 2-dimensional array is shown that includes six rows of LABs. In this embodiment, the V4 line allows vertical unidirectional communication over a distance covering four function blocks. A V4 line 750 has a starting point at a row (N+5) and an ending point at a row (N+1). The V4 line 750 can connect to LABs 733–742. A multiplexer 759 selects one of the inputs as its output and this output is driven on the V4 line 750 by a driver 761. The V4 line 750 is driven once at its starting point and thus is an unidirectional line. In FIG. 9, the V4 line 750 is driven upstream towards the top edge of the chip from its starting point at the Row (N+5) to the ending point at the Row (N+1). In another embodiment, the V4 line can be driven downstream towards the bottom edge of the chip or is a bi-directional line.

The V4 line 750 can connect to H4 lines at every row it crosses. In FIG. 9, the V4 line 750 connects to H4 lines 726–729. An optimal stitch 759 is the connection of the V4 line 750 at its endpoint to a V4 line 753 thus extending the reach of a signal carried on the V4 line 750 to the next four rows. For the optimal stitch 759, the V4 line 750 is connected to an input of a multiplexer 755. A driver 757 drives an output of the multiplexer 755 on the V4 line 753. Using the multiplexer 755 and the driver 757, a signal on the V4 line 750 can also reach the four rows spanned by the V4 line 753. A sub-optimal stitch is the connection to another V4 line prior to reaching the end point of the V4 line 750. That is, with the sub-optimal stitch, a connection to another V4 line occurs at any one of the rows (N+4), (N+3), or (N+2). The sub-optimal stitch 747 extends the reach of a signal carried on the V4 line 750 to include those rows spanned by the other V4 line.

The V4 line 750 can be driven by a LAB output, a H4 line, a H24 line, a V16 line or the V4 line. In FIG. 9, the inputs of the multiplexer 759 are connected to a H4 line, a V4 line, a H4 line 725, an output from the LAB 733, or an output from the LAB 734.

In this embodiment, the V4 line and the H4 line have the same logical length but have different physical lengths.

Figure 10:
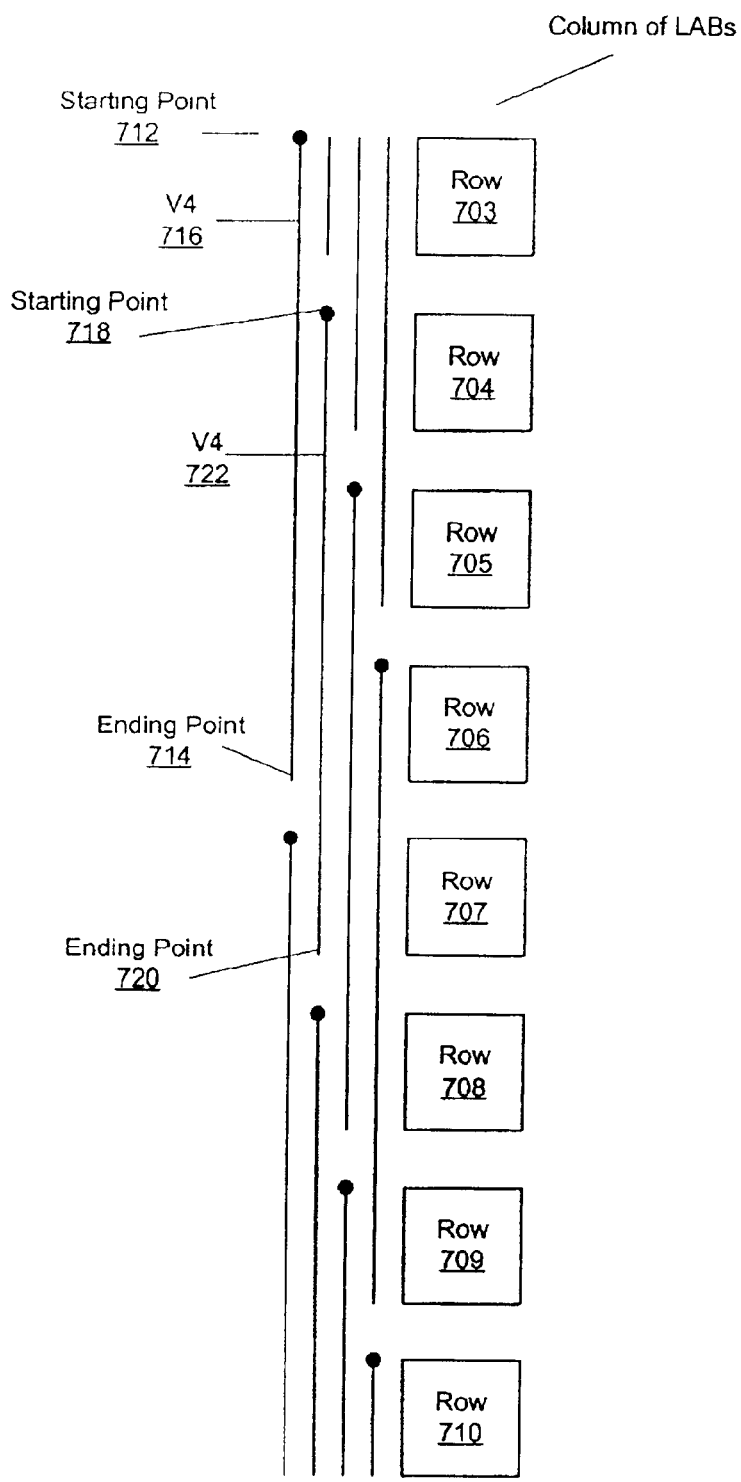
FIG. 10 shows an embodiment of V4 line staggering according to the present invention.

FIG. 10 shows an embodiment of V4 line staggering according to the present invention. A V4 line 716 has a starting point 712 and an ending point 714 that is four rows away (i.e., the V4 line 716 spans the rows 703–706). A V4 line 722 has a starting point 718 and an ending point 720 that is four rows away (i.e., the V4 line 722 spans the rows 704–707). The V4 line 716 is driven by a driver at the starting point 712 and the V4 line 722 is driven by a driver at the starting point 718. This offsetting of the start and end point of each line by one or more rows results in staggering. In FIG. 10, the starting point 718 is offset from the starting point 712 by one row (i.e., the row 703) and the ending point 720 is offset from the ending point 714 by one row (i.e., the row 707).

Figure 11:
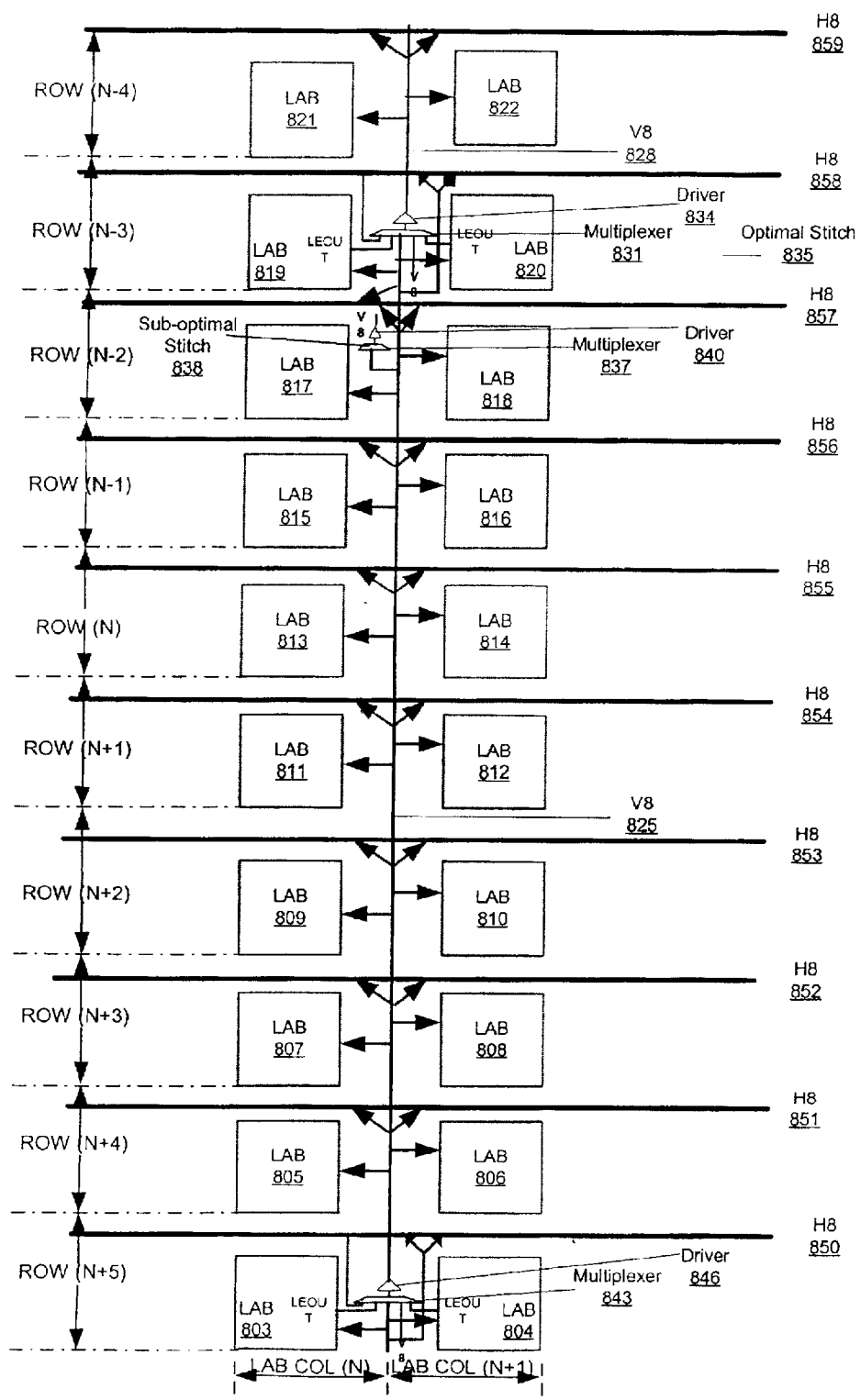
FIG. 11 shows an embodiment of a V8 line according to the present invention.

FIG. 11 shows an embodiment of a V8 line according to the present invention. A column of a 2-dimensional array is shown that includes ten rows of LABs. In this embodiment, the V8 line allows vertical unidirectional communication over a distance covering eight function blocks. As described earlier for the V4 lines, the V8 lines can also be similarly staggered such that the start and end point of each line is offset by one function block. A V8 line 825 has a starting point at a Row (N+5) and an ending point at a Row (N−3). The V8 line 825 can directly connect to the LABs 805–820. A multiplexer 843 selects one of the inputs as its output and this output is driven on the V8 line 825 by a driver 846. The V8 line 825 is driven once at its starting point and thus is an unidirectional line. In FIG. 11, the V8 line 825 is driven upward toward the top edge of the chip from its starting point at the Row (N+5) to the ending point at the Row (N−3). In another embodiment, the V8 line is driven downward toward the bottom edge of the chip or is a bi-directional line. The V8 line can connect to right-driving and left-driving H8 lines at every row it crosses. In FIG. 11, the V8 line 825 connects to the H8 lines 851–858.

An optimal stitch 835 is the connection of the V8 line 825 at its endpoint to a V8 line 828 thus extending the reach of a signal carried on the V8 line 825 to the next eight LABs spanned by the V8 line 828. For the optimal stitch 835, the V8 line 825 is connected to an input of a multiplexer 831. A driver 834 drives an output of the multiplexer 831 on the V8 line 828. Using the multiplexer 831 and the driver 834, a signal on the V8 line 825 can also reach the eight LABs spanned by the V8 line 828. A sub-optimal stitch is the connection to another V8 line prior to reaching the end point of the V8 line 825. That is, with the sub-optimal stitch, a connection from the V8 line 825 to another V8 line occurs at any one of the rows from Row (N+4) to Row (N−2). A sub-optimal stitch 838 includes a multiplexer 837 and a driver 840 at the Row (N−2). The multiplexer 837 has one of its inputs coupled to the V8 line 825. An output of the multiplexer 837 is sent to the driver 840 that drives the output onto the V8 line. The sub-optimal stitch 838 extends the reach of a signal carried on the V8 line 825 to include those LABs spanned by the V8 line.

The V8 line 825 can be driven by a LAB output, the H8 line or another V8 line. In FIG. 11, the inputs of the multiplexer 843 are connected to a H8 line 850, two other V8 lines, an output from the LAB 803, and an output from the LAB 804.

In this embodiment, the V8 lines and the H8 lines have the same logical lengths but different physical lengths. Further in this embodiment, the V8 lines are longer than the V4 lines and a signal travels on the V8 lines faster than on the V4 lines. The signal travels faster on the V8 lines because the V8 lines have twice the width and spacing compared to the V4 lines in the chip layout and because the V8 lines use larger drivers.

Figure 12:
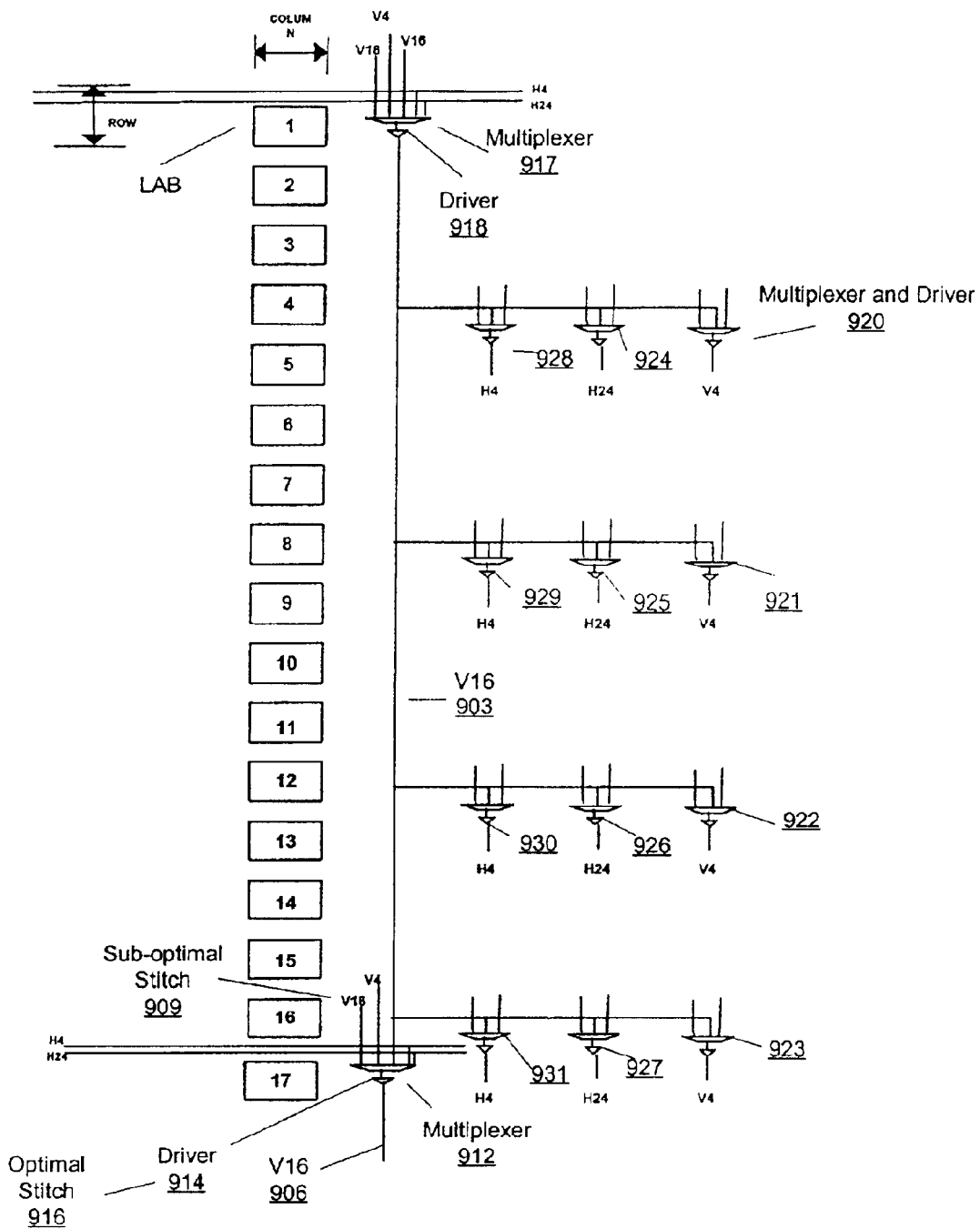
FIG. 12 shows an embodiment of a V16 line according to the present invention.

FIG. 12 shows an embodiment of a V16 line according to the present invention. The V16 line and the H24 line have substantially the same physical length but different logical lengths. The physical length of each wire is substantially close to the electrically optimum physical length or an adjustment of the electrically optimum physical length to account for non-electrical considerations. In another embodiment, the V16 line and the H24 line may have substantially the same physical length but different logical lengths. In yet another embodiment, the V16 line and the H24 line have different logical lengths and are used in combination with other lines that have the same logical length such as the H4 line and the V4 line.

In FIG. 12, a column of a 2-dimensional array is shown that includes seventeen rows of LABs. The V16 line allows vertical unidirectional communication over a distance covering sixteen function blocks. The V16 lines are double staggered, i.e., the V16 lines are offset by two function blocks from each other rather than offset by one function block as in the V4 or the V8 staggering. In another embodiment, the offset may be zero, one, or more than two function blocks. In FIG. 12, a V16 line 903 has a starting point at a LAB # 1 and an ending point at a LAB # 17. A multiplexer 917 selects one of the inputs as its output and this output is driven on the V16 line 903 by a driver 918. The V16 line 903 is driven once at its starting point and thus is an unidirectional line. In FIG. 12, the V16 line 903 is driven downward towards the bottom edge of the chip from its starting point at the LAB #1 to the ending point at the LAB #17. In another embodiment, the V16 line is driven upward to the top edge of the chip or is a bi-directional line.

In this embodiment, the V16 line 903 connects to the H4, the V4, and the H24 lines at every fourth LAB. Connections to these lines (the H4, the V4, and the H24 lines) are made using multiplexer and drivers 920–931. An optimal stitch 916 is the connection of the V16 line 903 at its endpoint to a V16 line 906 thus extending the reach of a signal carried on the V16 line 903 to span the next sixteen LABs. For the optimal stitch 916, the V16 line 903 is connected to an input of a multiplexer 912. A driver 914 drives an output of the multiplexer 912 onto the V16 line 906. Using the multiplexer 912 and the driver 914, a signal on the V16 line 903 can also span the sixteen LABs covered by the V16 line 906. A sub-optimal stitch is the connection to another V16 line prior to reaching the end point of the V16 line 903. In FIG. 12, a sub-optimal stitch 909 is shown where it is assumed that a V16 line that is input into the multiplexer 912 is from the V16 line prior to its endpoint. The multiplexer 912 and the driver 914 drive a signal carried on that V16 line onto the V16 line 906.

The V16 line 903 can be driven by the H4 line, the H24 line, the V4 line, and another V16 line. In FIG. 12, the inputs of the multiplexer 917 are connected to a H4 line, a H24 line, a V4 line, and two V16 lines. In this embodiment, the V16 lines do not directly connect to the function blocks.

In this embodiment, the V16 lines are longer than the V8 lines and a signal travels on the V16 lines faster than on the V8 lines. The V16 lines are faster than two V8 lines combined and are routed in the top thick metal layers of the chip. The V16 lines are faster than the V8 lines because the V16 lines are wider, thicker, and spaced farther apart on the chip. The V16 lines also use larger drivers than the V8 lines thus adding to its greater speed.

In another embodiment, each of the V-lines and H-lines can be driven by any of the wire types and each of these lines can also drive all the types of lines. For example, a V4 line can drive a H4 line, a H8 line, a H24 line, another V4 line, a V8 line and a V16 line. In addition, a V4 line can be driven by a H4 line, a H8 line, a H24 line, another V4 line, a V8 line, a V16 line, and the output of a function block.

The PLDs according to the present invention may be included in a processor that is part of an electronic system. The electronic system may be a digital computing system such as a general or special purpose computer, or a specialized digital switching network, or other processing system.

While the present invention has been particularly described with respect to the illustrated embodiments, it will be appreciated that various alterations, modifications and adaptations may be based on the present disclosure, and are intended to be within the scope of the present invention. While the invention has been described in connection with what are presently considered to be the most practical and preferred embodiments, it is to be understood that the present invention is not limited to the disclosed embodiment but, on the contrary, is intended to cover various modifications and equivalent arrangements included within the scope of the claims.

What is claimed is:

1. Within a programmable logic device, a routing architecture to interconnect a plurality of function blocks, comprising:
    a plurality of wires oriented in a first direction, wherein the wires oriented in the first direction have a physical length that is an adjustment of an electrically optimum physical length to account for non-electrical considerations.

2. The routing architecture of claim 1, further comprising a plurality of wires oriented in a second direction for transmitting signals between the function blocks, wherein the physical length of the wires oriented in the first direction is substantially the same as a physical length of the wires oriented in the second direction.

3. The routing architecture of claim 1 wherein the non-electrical considerations include at least one of the routing efficiency of the wires at the electrically optimum physical length and the pattern of connections to the wires.

4. The routing architecture of claim 1, further comprising a plurality of wires oriented in a second direction for transmitting signals between the function blocks, wherein the physical length of the wires oriented in the first direction substantially differs from a physical length of the wires oriented in the second direction.

5. The routing architecture of claim 1 wherein the first direction is substantially orthogonal to the second direction.

6. The routing architecture of claim 5 wherein the first direction and the second direction are any one of a horizontal direction and a vertical direction, the vertical direction and the horizontal direction, a diagonal direction up to the right and a diagonal direction up to the left, or the diagonal direction up to the left and the diagonal direction up to the right.

7. The routing architecture of claim 1 wherein each of the plurality of function blocks is a logic array block, a memory block, an input/output block, or a multiply-accumulate block.

8. A digital system including the programmable logic device of claim 1.

9. Within a programmable logic device, a two-dimensional routing architecture to interconnect a plurality of function blocks, comprising:
    a wire having a logical length that is a function of an orientation of the wire and having a physical length that is an adjustment of an electrically optimum physical length to account for non-electrical considerations,
    wherein the wire inerconnects a subset of the plurality of function blocks.

10. The two-dimensional routing architecture of claim 9 wherein the non-electrical considerations include at least one of the routing efficiency of the wire at the electrically optimum physical length and the pattern of connections to the wire.

11. The two-dimensional routing architecture of claim 9 wherein the orientation of the wire is any one of a vertical direction, a horizonal direction, a diagonal direction up to the left, or a diagonal direction up to the right.

12. The two-dimensional routing architecture of claim 9 wherein each of the plurality of function blocks is a logic array block, a memory block, an input/output block, or a multiply-accumulate block.

13. The two-dimensional routing architecture of claim 9 wherein each of the plurality of function blocks has a height that differs from its width.

14. A digital system including the pogrammable logic device of claim 9.

15. A method to interconnect a plurality of function blocks within a programmable logic device, comprising:
    determining a physical length that is electrically optimum for a wire;
    adjusting the determined physical length to account for non-electrical considerations;
    providing the wire having a physical length that is substantially the same as the determined physical length; and
    connecting the plurality of function blocks to the wire,
    wherein a logical length of the wire is a function of an orientation of the wire.

16. The method of claim 15 wherein the non-electrical considerations include at least one of the routing efficiency of the wire at the physical length that is electrically optimum and the pattern of connections to the wire.

17. The method of claim 15 wherein determining the physical length that is optimum for the wire includes
    modeling the programmable logic device that includes the plurality of function blocks and the wire;
    varying the physical length of the wire a plurality of times;
    for each of the plurality of physical length variations, determining the time for a signal to traverse the wire having the particular one of the plurality of physical length variations;
    for each of the plurality of times for the signal to traverse the wire having the particular one of the plurality of physical length variations, converting this time to the time for the signal to traverse one unit length; and
    from the plurality of times for the signal to traverse one unit length, selecting a particular one of the plurality of times for the signal to traverse one unit length that is the least time to traverse one unit length.

18. The method of claim 15 wherein each of the plurality of function blocks is a logic array block, a memory block, an input/output block, or a multiply-accumulate block.

19. Within a programmable logic device, a two-dimensional routing architecture to interconnect a plurality of function blocks, comprising:

a first subset of a plurality of wires having a first logical length and a physical length for transmitting signals between the function blocks; and a second subset of the plurality of wires having a second logical length and a physical length that is substantially the same as the physical length of the first subset of the pluality of wires for transmitting signals between the function blocks, wherein the first logical length differs from the second logical length, and the physical length of the first subset of the plurality of wires is an adjustment of an electrically optimum physical length to account for non-electrical considerations.

20. The two-dimensional routing architecture of claim 19 wherein the physical length of the first subset of the plurality of wires is substantially the same as the physical length of the second subset of the plurality of wires.

21. The two-dimensional routing architecture of claim 19, wherein the non-electrical onsiderations include at least one of the routing efficiency of the wire at the physical length that is electrically optimum and the pattern of connections to the wire.

22. The two-dimensional routing architecture of claim 19 wherein the first subset of the plurality of wires is oriented in a first direction and the second subset of the plurality of wires is oriented in a second direction.

23. Within a programmable logic device, a two-dimensional routing architecture to interconnect a plurality of function blocks, comprising:

a first subset of a plurality of wires having first logical length and a physical length;

a second subset of the plurality of wires having a second logic length and a physical length that is substantially the same as the physical length of the first subset of the plurality of wires, wherein the first logical length differs from the second logical length, and the first subset of the plurality of wires is oriented in a first direction and the second subset of the plurality of wires is oriented in a second direction;

a third subset of the plurality of wires oriented in the first direction and having a third logical length that is shorter than the first logical length;

a fourth subset of the plurality of wires oriented in the second direction and having the third logical length;

a fifth subset of the plurality of wires oriented in the first direction and having a fourth logical length that is shorter than the third logical length; and a sixth subset of the plurality of wires oriented in the second direction and having the fourth logical length, wherein a physical length of the third subset of the plurality of wires differs from a physical length of the fourth subset of the plurality of wires and a physical length of the fifth subset of the plurality of wires differs from a physical length of the six subset of the plurality of wires.

24. The two-dimensional routing architecture of claim 23, wherein the first direction is substantially orthogonal to the second direction.

25. The two-dimensional routing architecture of claim 24 wherein the first direction is a horizontal direction and the second direction is a vertical direction and the first logical length is 24 function blocks, the second logical length is 16 function blocks, the third logical length is 8 function blocks, and the fourth logical length is 4 function blocks.

26. The two-dimensional routing architecture of claim 23, wherein a first one of the plurality of wires is oriented in a stagger direction and has a first starting point, a first ending point, and a stagger logical length;

a second one of the plurality of wires is oriented in the stagger direction and has a second starting point, a second ending point, and the stagger logical length; and if the stagger direction is a horizontal direction then the first starting point is offset from the second starting point and the first ending point is offset from the second ending point by a fixed number of a plurality of columns of function blocks of an array of function blocks, or if the stagger direction is a vertical direction then the first starting point is offset from the second starting point and the first ending point is offset from the second ending point by the fixed number of a plurality of rows of function blocks of the array of function blocks.

27. The two-dimensional routing architecture of claim 26 wherein the fixed number is any one of zero, one, or two.

28. The two-dimensional routing architecture of claim 23, wherein the first direction is a horizontal direction, a first wire of a particular one of the first subset of the plurality of wires, the third subset of the plurality of wires, or the fifth subset of the plurality of wires has a first starting point, and a second wire of the particular one of the subsets has a second starting point; and the architecture further comprises:

a first driver having an output, the output coupled to the first wire at the first starting point, to drive a first signal on the first wire to the right;

a second driver haing an output, the output coupled to the second wire at the second starting point, to drive a second signal on the second wire to the left.

29. The two-dimensional routing rchitecture of claim 23, wherein the second direction is a vertical direction, a first wire of a particular one of the second subset of the plurality of wires, the fourth subset of ythe plurality of wires, or the sixth subset of the plurality of wires has a first starting point, and a second wire of the particular one of the subsets has a second starting point; and the architecture further comprises:

a first driver having an output, the output coupled to the first wire at the first starting point, to drive a first signal on the first wire in the upward direction;

a second driver having an output, the output coupled to the second wire at the second starting point, to drive a second signal on the second wire in the downward direction.

30. The two-dimensional routing architecture of claim 23, wherein a first one of the plurality of wires is oriented in a stitching direction and has a signal flow direction, a stitching logical length, a first starting point, and a first ending point that is the stitching logical length away in the signal flow direction from the first starting point; and a second one of the plurality of wires is oriented in the stitching direction and has the signal flow direction, the stitching logical length, a second starting point, and a second ending point that is the stitching logical length away in the signal flow direction from the second starting point; and the architecture further comprises:

a driver having an input and an output, the input coupled to the first one of the plurality of wires at a position ranging from the first starting point to the first ending point and the output coupled to the second one of the plurality of wires to the second starting point, to drive the signal on the second one of the plurality of wires in the signal flow direction from the second starting point to the second ending point.

31. The two-dimensional routing architecture of claim 30 wherein the input of the second driver is coupled to the first one of the plurality of wires at the first ending point.

32. The two-dimensional routing architecture of claim 23, wherein a first one of the fifth subset of the pluraity of wires oriented in the first direction is coupled to at least one of a first one of the first subset of the plurality of wires oriented in the first direction, a first one of the second subset of the plurality of wires oriented in the second direction, a first one of the sixth subset of the plurality of wires oriented in the second direction, and a particular one of the plurality of function blocks spanned by the first one of the fifth subset of the plurality of wires;

a first one of the third subset of the plurality of wires oriented in the first direction is coupled to at least one of a first one of the fourth subset of the plurality of wires oriented in the second direction, and a particular one of the plurality of function blocks spanned by the first one of the third subset of the plurality of wires;

a second one of the first subset of the plurality of wires oriented in the first direction is coupled to at least one of a second one of the fifth subset of the plurality of wires oriented in the first direction, a second one of the second subset of the plurality of wires oriented in the second direction, and a second one of the sixth subset of the plurality of wires oriented in the second direction;

a third one of the sixth subset of the plurality of wires oriented in the second direction is coupled to at least one of a third one of the first subset of the plurality of wires oriented in the first direction, a third one of the fifth subset of the plurality of wires oriented in the first direction, a third one of the second subset of the plurality of wires oriented in the second direction, and a particular one of the plurality of function blocks spanned by the third one of the sixth subset of the plurality of wires;

a second one of the fourth subset of the plurality of wires oriented in the second direction is coupled to at least one of a second one of the third subset of the plurality of wires oriented in the first direction, and a particular one of the plurality of function blocks spanned by the second one of the fourth subset of the plurality of wires; and a fourth one of the second subset of the plurality of wires oriented in the second direction is coupled to at least one of a fourth one of the first subset of the plurality of wires oriented in the first direction, a fourth one of the fifth subset of the plurality of wires oriented in the first direction, and a fourth one of the sixth subset of the plurality of wires oriented in the second direction.

33. The two-dimensional routing architecture of clim 23, further comprising:

a plurality of rows and a plurality of columns of function blocks;

a first driver corresponding to a first one of the plurality of columns of function blocks and having at least one input and an output, the at least one input coupled to at least one of a first one of the first subset of the plurality of wires, a first one of the second subset of the plurality of wires, a first one of the sixth subset of the plurality of wires, an output of the first one of the plurality of columns of function blocks, and an output of a second one of the plurality of columns of function blocks that is adjacent to the first one of the plurality of columns of function blocks, and the output of the first driver coupled to a first one of the fifth subset of the plurality of wires;

a second driver corresponding to a third one of the plurality of columns of function blocks and having at least one input and an output, the at least one input coupled to at least one of a first one of the fourth subset of the pllurality of wires, an output of the third one of the plurality of columns of function blocks, and an output of a fourth one of the plurality of columns of function blocks that is adjacent to the third one of the plurality of columns of function blocks, and the output of the second driver coupled to a first one of the third subset of the plurality of wires;

a third driver having at least one input and an output, the at least one input coupled to at least one of a second one of the fifth subset of the plurality of wires, a second one of the second subset of the plurality of wires, and a second one of the sixth subset of the plurality of wires, and the output of the third driver coupled to a second one of the first subset of the plurality of wires;

a fourth driver corresponding to a first one of the plurality of rows of function blocks and having at least one inlput and an output, the at least one input coupled to at least one of a third one of the first subset of the plurality of wires, a third one of the fifth subset of the plurality of wires, a third one of the second subset of the plurality of wires, an output of the first one of the plurality of rows of function blocks, and an output of a second one of the plurality of rows of function blocks that is adjacent to the first one of the plurality of rows of function block, and the output of the fourth driver coupled to a third one of the sixth subset of the plurality of wires;

a fifth driver corresponding to a third one of the plurality of rows of function blocks and having at least one input and an output, the at least one input coupled to at least one of a second one of the third subset of the plurality of wires, an output of the third one of the plurality of rows of function blocks, and an output of a fourth one of the plurality of rows of function blocks that is adjacent to the third one of the plurality of rows of function blocks, and the output of the fifth driver coupled to a second one of the fourth subset of the plurality of wires; and a sixth driver having at least one input and an output, the at least one input coupled to at least one of a fourth one of the first subset of the plurality of wires, a fourth one of the fifth subset of the plurality of wires, and a fourth one of the sixth subset of the plurality of wires, and the output of the sixth driver coupled to a fourth one of the second subset of the plurality of wires.

34. The two-dimensional routing architecture of claim 23 wherein the first subset of the plurality of wires is wider than the third subset of the plurality of wires, the third subset of the plurality of wires is wider than the fifth subset of the plurality of wires, the second subset of the plurality of wires is wider than the fourth subset of the plurality of wires, and the fourth subset of the plurality of wires is wider than the sixth subset of the plurality of wires.

35. Within a programmable logic device, a two-dimensional routing architecture to interconnect a plurality of function blocks, comprising:

a first subset of a plurality of wires having a first logical length and a physical length;

a second subset of the plurality of wires having a second logical length and a physical length that is substantially the same as the physical length of the first subset of the plurality of wires, wherein the first logical length differs from the second logical length, and the first subset of the plurality of wires is oriented in a first direction and the second subset of the plurality of wires is oriented in a second direction;

a third subset of the plurality of wires oriented in the first direction and having a third logical length that is shorter than the first logical length; and a fourth subset of the plurality of wires oriented in the second direction and having the third logical length, wherein a physical length of the third subset of the plurality of wires differs from a physical length of the fourth subset of the plurality of wires.

36. The two-dimensional routing architecture of claim 35, wherein the first direction is substantially orthogonal to the second direction.

37. The two-dimensional routing architecture of claim 36, wherein the first direction is a horizontal direction and the second direction is a vertical direction and the first logical length is 24 function blocks, the second logical length is 16 function blocks, the third logical length is 4 function blocks.

38. The two-dimensional routing architecture of claim 35, wherein a first one of the plurality of wires is oriented in a stagger direction and has a first starting point, a first ending point, and a stagger logical length;

a second one of the plurality of wires is oriented in the stagger direction and has a second starting point, a second ending point, and the stagger logical length; and if the stagger direction is a horizontal direction then the first starting point is offset from the second starting point and the first ending point is offset from the second ending point by a fixed number of a plurality of columns of function blocks of an array of function blocks, or if the stagger direction is a vertical direction then the first starting point is offset from the second starting point and the first ending point is offset from the second ending point by the fixed number of a plurality of rows of function blocks of the array of function blocks.

39. The two-dimensional routing architecture of claim 38, wherein the fixed number is any one of zero, one, or two.

40. The two-dimensional routing architecture of claim 5, wherein the first direction is a horizontal direction, a first wire of a particular one of the first subset of the plurality of wires or the third subset of the plurality of wires has a first starting point, and a second wire of the particular one of the subsets has a second starting point; and the architecture further comprises:

a first driver having an output, the output coupled to the first wire at the first starting point, to drive a first signal on the first wire to the right; and a second driver having an output, the output coupled to the second wire at the second starting point, to drive a second signal on the second wire to the left.

41. The two-dimensional routing architecture of claim 35, wherein the second direction is a vertical direction, a first wire of a particular one of the second subset of the plurality of wires or the fourth subset of the plurality of wires has a first starting point, and a second wire of the particular one of the subsets has a second starting point; and the architecture further comprises:

a first driver having an output, the output coupled to the first wire at the first starting point, to drive a first signal on the first wire in the upward direction; and a second driver having an output, the output coupled to the second wire at the second starting point, to drive a second signal on the second wire in the downward direction.

42. The two-dimensional routing architecture of claim 35, wherein a first one of the plurality of wires is oriented in a stitching direction and has a signal flow direction, a stitching logical length, a first starting point, and a first ending point that is the stitching logical length away in the signal flow direction from the first starting point; and a second one of the plurality of wires is oriented in the stitching direction and has the signal flow direction, the stitching logical length, a second starting point, and a second ending point that is the stitching logical length away in the signal flow direction from the second starting point; and the architecture further comprises:

a driver having an input and an output, the input coupled to the first one of the plurality of wires at a position ranging from the first starting point to the first ending point and the output coupled to the second one of the plurality of wires at the second starting point, to drive the signal on the second one of the plurality of wires in the signal flow direction from the second starting point to the second ending point.

43. The two-dimensional routing architecture of claim 42, wherein the input of the second driver is coupled to the first one of the plurality of wires at the first ending point.

44. The two-dimensional routing architecture of claim 35, wherein a first one of the third subset of the plurality of wires oriented in the first direction is coupled to at least one of a first one of the first subset of the plurality of wires oriented in the first direction, a first one of the second subset of the plurality of wires oriented in the second direction, a first one of the plurality of function blocks spanned by the first one of the third subset of the plurality of wires;

a second one of the first subset of the plurality of wires oriented in the first direction is coupled to at least one of a second one of the third subset of the plurality of wires oriented in the first direction, a second one of the second subset of the plurality of wires oriented in the second direction, and a second one of the fourth subset of the plurality of wires oriented in the second direction;

a third one of the fourth subset of the plurality of wires oriented in the second direction is coupled to at least one of a third one of the first subset of the plurality of wires oriented in the first direction, a third one of the third subset of the plurality of wires oriented in the first direction, a third one of the plurality of function blocks spanned by the third one of the fourth subset of the plurality of wires; and a fourth one of the second subset of the plurality of wires oriented in the second direction is coupled to at least one of a fourth one of the first subset of the plurality of wires oriented in the first direction, a fourth one of the third subset of the plurality of wires oriented in the first direction, a fourth one of the fourth subset of the plurality of wires oriented in the second direction.

45. The two-dimensional routing architecture of claim 35, further comprising:

a plurality of rows and a plurality of columns of function blocks;

a first driver corresponding to a first one of the plurality of columns of function blocks and having at least one input and an output, the at least one input coupled to at least one of a first one of the first subset of the plurality of wires, a first one of the second subset of the plurality of wires, a first one of the fourth subset of the plurality of wires, an output of the first one of the plurality of columns of function blocks, and an output of a second one of the plurality of columns of function blocks that is adjacent to the first one of the plurality of columns of function blocks, and the output of the first driver coupled to a first one of the third subset of the plurality of wires;

a second driver having at least one input and an output, the at least one input coupled to at least one of a second one of the third subset of the plurality of wires, a second one of the second subset of the plurality of wires, and a second one of the fourth subset of the plurality of wires, and the output of the third driver coupled to a second one of the first subset of the plurality of wires;

a third driver corresponding to a first one of the pllurality of rows of function blocks and having at least one input and an output, the at least one input coupled to at least one of a third one of the first subset of the plurality of wires, a third one of the third subset of the plurality of wires, a third one of the second subset of the plurality of wires, an output of the first one of the plurality of rows of function blocks, and an output of a second one of the plurality of rows of function blocks that is adjacent to the first one of the plurality of rows of function blocks, and the output of the fourth driver coupled to a third one of the fourth subset of the plurality of wires; and a fourth driver having at least one input and an output, the at least one input coupled to a at least one of fourth one of the first subset of the plurality of wires, a fourth one of the third subset of the plurality of wires, and a fourth one of the fourth subset of the plurality of wires, and the output of the sixth driver coupled to a fourth one of the second subset of the plurality of wires.

46. The two-dimensional routing architecture of claim 35, wherein the first subset of the plurality of wires is wider than the third subset of the plurality of wires, the second subset of the plurality of wires is wider than the fourth subset of the plurality of wires.

* * * * *

UNITED STATES PATENT AND TRADEMARK OFFICE
CERTIFICATE OF CORRECTION

PATENT NO. : 6,895,570 B2
DATED : May 17, 2005
INVENTOR(S) : David Lewis et al.

It is certified that error appears in the above-identified patent and that said Letters Patent is hereby corrected as shown below:

Column 12,
Line 8, please replace "inerconnects" with -- interconnects --.
Line 17, please replace "horizonal" with -- horizontal --.
Line 25, please replace "pogrammable" with -- programmable --.
Line 66, please replace "pluallty" with -- plurality --.

Column 13,
Line 20, please replace "onsiderations" with -- considerations --.
Lines 32-33, please replace "wires having first logical length" with -- wires having a first logical length --.
Lines 35-36, please replace "wires having a second logic length" with -- wires having a second logical length --.
Line 58, please replace "length of the six subset" with -- length of the sixth subset --.

Column 14,
Line 39, please replace "haing" with -- having --.
Line 42, please replace "rchilecture" with -- architecture --.
Line 46, please replace "the fourth subset of ythe plurality of wires," with -- the fourth subset of the plurality of wires, --.

Column 15,
Line 8, please replace "plurality of wires to the second starting point," with -- plurality of wires at the second starting point, --.
Line 19, please replace "pluraity" with -- plurality --.

Column 16,
Line 1, please replace "clim 23," with -- claim 23, --.
Line 22, please replace "pllurality" with -- plurality --.
Line 38, please replace "iniput" with -- input --.
Line 48, please replace "of function block," with -- of function blocks, --.

Column 17,
Line 64, please replace "of claim 5," with -- of claim 35, --.

Column 18,
Line 57, please replace "a first one of the plurality of function blocks" with -- a first one of the fourth subset of the plurality of wires oriented in the second direction, and a particular one of the plurality of function blocks --.

UNITED STATES PATENT AND TRADEMARK OFFICE
CERTIFICATE OF CORRECTION

PATENT NO. : 6,895,570 B2
DATED : May 17, 2005
INVENTOR(S) : David Lewis et al.

It is certified that error appears in the above-identified patent and that said Letters Patent is hereby corrected as shown below:

Column 19,
Line 6, please replace "a third one of the plurality of function blocks" with -- a third one of the second subset of the plurality of wires oriented in the second direction, and a particular one of the plurality of function blocks --.

Column 20,
Line 6, please replace "pllurality" with -- plurality --.

Signed and Sealed this

Thirtieth Day of August, 2005

JON W. DUDAS
*Director of the United States Patent and Trademark Office*